United States Patent
Fabreguette et al.

(10) Patent No.: US 10,937,654 B2
(45) Date of Patent: Mar. 2, 2021

(54) METHODS OF DOPING A SILICON-CONTAINING MATERIAL AND METHODS OF FORMING A SEMICONDUCTOR DEVICE

(71) Applicant: Micron Technology, Inc., Boise, ID (US)

(72) Inventors: Francois H. Fabreguette, Boise, ID (US); John A. Smythe, Boise, ID (US); Witold Kula, Gilroy, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/256,918

(22) Filed: Jan. 24, 2019

(65) Prior Publication Data
US 2020/0243339 A1   Jul. 30, 2020

(51) Int. Cl.
| H01L 21/225 | (2006.01) |
| H01L 21/306 | (2006.01) |
| H01L 21/02 | (2006.01) |
| H01L 21/3215 | (2006.01) |
| H01L 21/385 | (2006.01) |
| H01L 21/324 | (2006.01) |
| H01L 21/3115 | (2006.01) |

(52) U.S. Cl.
CPC ...... *H01L 21/2257* (2013.01); *H01L 21/0228* (2013.01); *H01L 21/306* (2013.01); *H01L 21/02694* (2013.01); *H01L 21/2251* (2013.01); *H01L 21/2254* (2013.01); *H01L 21/3115* (2013.01); *H01L 21/324* (2013.01); *H01L 21/3215* (2013.01); *H01L 21/385* (2013.01)

(58) Field of Classification Search
CPC ............. H01L 21/2251; H01L 21/2254; H01L 21/0257; H01L 21/3215; H01L 21/324; H01L 21/02694; H01L 21/3115; H01L 21/385; H01L 21/2257
See application file for complete search history.

(56) References Cited

U.S. PATENT DOCUMENTS

| 4,569,701 | A | * | 2/1986 | Oh | H01L 21/2257 148/DIG. 35 |
| 5,324,684 | A | * | 6/1994 | Kermani | H01L 21/2254 438/566 |
| 6,057,216 | A | * | 5/2000 | Economikos | H01L 21/2255 257/E21.149 |
| 6,316,310 | B1 | * | 11/2001 | Wensley | H01L 21/2255 257/E21.149 |
| 7,223,653 | B2 | * | 5/2007 | Cheng | H01L 27/1087 257/E27.092 |
| 8,569,158 | B2 | * | 10/2013 | Clark | H01L 21/2256 257/E21.135 |
| 8,709,924 | B2 | | 4/2014 | Hanawa et al. | |

(Continued)

*Primary Examiner* — David A Zarneke
(74) *Attorney, Agent, or Firm* — TraskBritt

(57) ABSTRACT

A method of doping a silicon-containing material. The method comprises forming at least one opening in a silicon-containing material and conformally forming a doped germanium material in the at least one opening and adjacent to the silicon-containing material. A dopant of the doped germanium material is transferred into the silicon-containing material. Methods of forming a semiconductor device are also disclosed, as are semiconductor devices comprising a doped silicon-containing material.

24 Claims, 4 Drawing Sheets

(56) References Cited

U.S. PATENT DOCUMENTS

| | | | |
|---|---|---|---|
| 8,956,983 B2 | 2/2015 | Swaminathan et al. | |
| 9,029,226 B2 | 5/2015 | Tsai et al. | |
| 9,076,719 B2 | 7/2015 | Segalman et al. | |
| 9,177,812 B2 | 11/2015 | Martens et al. | |
| 9,318,390 B2 | 4/2016 | Rouh et al. | |
| 9,378,957 B2 | 6/2016 | Liu et al. | |
| 9,570,307 B2 | 2/2017 | Nainani et al. | |
| 9,692,209 B2 | 6/2017 | Bessette et al. | |
| 9,929,014 B2 | 3/2018 | Cameron et al. | |
| 9,966,438 B2 * | 5/2018 | Huang | H01L 21/02579 |
| 2012/0142172 A1 | 6/2012 | Fox et al. | |
| 2014/0065799 A1 | 3/2014 | Ahmed | |
| 2016/0035728 A1 | 2/2016 | Jacob et al. | |
| 2018/0261696 A1 | 9/2018 | Glass et al. | |
| 2018/0308686 A1 * | 10/2018 | Xie | H01L 21/02532 |

* cited by examiner

METHODS OF DOPING A SILICON-CONTAINING MATERIAL AND METHODS OF FORMING A SEMICONDUCTOR DEVICE

TECHNICAL FIELD

Embodiments disclosed herein relate to semiconductor device fabrication. More particularly, embodiments of the disclosure relate to methods of doping a silicon-containing material, methods of forming a semiconductor device including a doped silicon-containing material, and related semiconductor devices.

BACKGROUND

A continuing goal of the semiconductor industry has been to increase the level of integration or density of features within a semiconductor device by reducing the dimensions of the individual features and by reducing the distance between neighboring features. One way of achieving higher density is by forming so-called "three dimensional (3D) structures" where the features are oriented in a vertical direction.

Doping of materials is used in semiconductor device fabrication to impart desirable properties to the materials. The dopant provides desirable electrical conductivity properties, optical properties, and structural properties. Conventional processes of doping include ion implantation of a dopant, diffusion of the dopant from a dopant source material, or transfer of the dopant from a film containing the dopant. However, as aspect ratios of openings or features in semiconductor devices increase, conventional doping processes are problematic. With ion implantation, dopant concentration (e.g., dose) and distribution are highly controllable but the material to be doped is typically damaged during the process. In addition, the directionality of the ion implantation process limits the ability to dope sidewalls of the 3D structures with the desired dopant concentration and distribution. Doping by diffusion is also problematic because the dopant concentration and distribution are not sufficiently controllable. Dopant transfer processes are limited by a degree of conformality of the film containing the dopant and the dopant concentration that is transferred.

DETAILED DESCRIPTION

Figure 1:
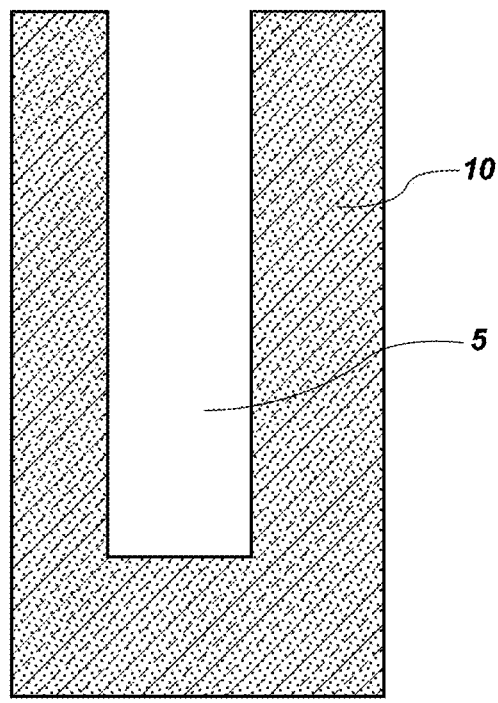
FIGS. 1-4 are cross-sectional views showing various stages of incorporating a dopant into a silicon-containing material in accordance with embodiments of the disclosure.

Methods of incorporating a dopant into a silicon-containing material are disclosed, as are methods of forming a semiconductor device including a doped silicon-containing material and semiconductor devices including the doped silicon-containing material. The doped silicon-containing material is configured as one or more high aspect ratio (HAR) features of the semiconductor device. To incorporate a dopant in the silicon-containing material, a conformal material is formed in openings in the silicon-containing material and the dopant is simultaneously incorporated into the conformal material, forming a doped conformal material. The doped conformal material is adjacent to the silicon-containing material and is conformally formed on sidewalls (e.g., vertical surfaces) and horizontal surfaces of the silicon-containing material at a substantially uniform thickness. The dopant is transferred from the doped conformal material to the silicon-containing material by subjecting the silicon-containing material and doped conformal material to an annealing act. Following the anneal, the dopant is uniformly dispersed (e.g., distributed) along the sidewalls and horizontal surfaces of the silicon-containing material. The doped conformal material is removable following the dopant transfer, without exposing the doped silicon-containing material to aggressive removal techniques. The methods according to embodiments of the disclosure are used to form semiconductor devices, such as memory devices, including the doped silicon-containing material configured as the HAR features.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device or a complete process flow for manufacturing the semiconductor device and the structures described below do not form a complete semiconductor device. Only those process acts and structures necessary to understand the embodiments described herein are described in detail below. Additional acts to form a complete semiconductor device may be performed by conventional techniques.

The materials described herein may be formed by conventional techniques including, but not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, the terms "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "aspect ratio" refers to a ratio of a height to a width of a feature or opening.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "semiconductor device" includes without limitation a memory device, as well as other semiconductor devices which may or may not incorporate memory, such as a logic device, a processor device, or a radiofrequency (RF) device. Further, a semiconductor device may incorporate memory in addition to other functions such as, for example, a so-called "system on a chip" (SoC) including a processor and memory, or a semiconductor device including logic and memory.

As used herein, the term "step coverage" means and includes a ratio of a thickness at a point on a sidewall of a material to a thickness at a point on a top horizontal surface of the material. A step coverage of 100% means that the thickness at the point on the sidewall is substantially the same as the thickness on the top horizontal surface. For instance, the thickness at one location on the material is substantially the same as the thickness at another location on the material.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOP") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As shown in FIG. 1, an opening 5 having a high aspect ratio (HAR) may be formed in a silicon-containing material 10. The opening 5 may have an aspect ratio of greater than or equal to about 30:1, such as from about 30:1 to about 200:1. The aspect ratio of the opening 5 may be from about 40:1 to about 100:1, from about 50:1 to about 100:1, from about 60:1 to about 100:1, from about 70:1 to about 100:1, from about 80:1 to about 100:1, or from about 90:1 to about 100:1. The silicon-containing material 10 may be silicon, polysilicon, a silicon oxide (e.g., $SiO_x$, $SiO_2$), or a combination thereof. The silicon-containing material 10 as formed may be amorphous or crystalline, and may be undoped. In some embodiments, the silicon-containing material 10 is silicon. In other embodiments, the silicon-containing material 10 is polysilicon. The silicon-containing material 10 may be utilized as at least a portion of the HAR feature of the semiconductor device in which doping is desired. While embodiments herein describe doping the silicon-containing material 10, other materials, such as a metal material or a metal oxide material, may be doped according to embodiments of the disclosure depending on the intended use of the doped material.

The opening 5 is defined by sidewalls and a lower surface of the silicon-containing material 10. The sidewalls of the silicon-containing material 10 are substantially vertical and the lower surface of the silicon-containing material 10 is substantially horizontal. The opening 5 may be formed by conventional techniques, which are not discussed in detail herein. For instance, conventional etch chemistries and etch conditions may be used to form the opening 5. While FIG. 1 shows one opening 5 and two vertically extending portions of the silicon-containing material 10, multiple openings 5 may be present.

Figure 2:
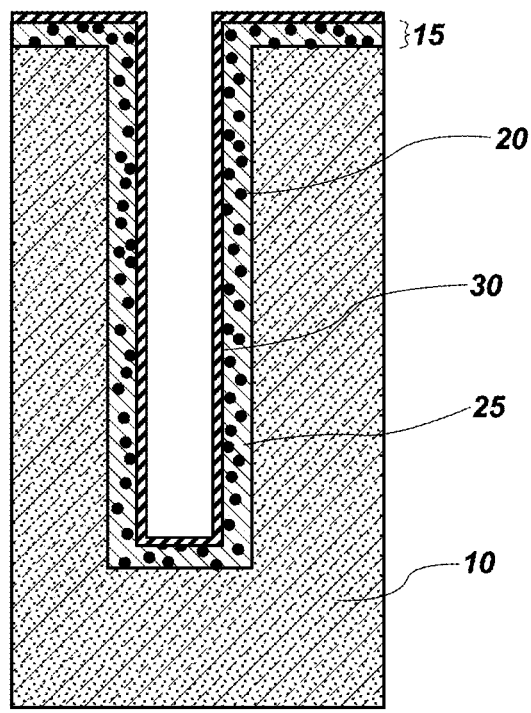

As shown in FIG. 2, a doped conformal material 15 including a dopant 20 in a conformal material 25 is formed adjacent to (e.g., on) the silicon-containing material 10. The doped conformal material 15 may be conformally formed over the horizontal surfaces and vertical surfaces of the silicon-containing material 10. The doped conformal material 15 may exhibit a high degree of conformality, such as exhibiting a step coverage of greater than or equal to about 90%, such as greater than or equal to about 95%, greater than or equal to about 99%, or about 100%. As formed, the doped conformal material 15 may be a discontinuous material in that the doped conformal material 15 is not formed over substantially all of the silicon-containing material 10. The doped conformal material 15 may include the dopant 20 substantially homogeneously dispersed therein. The doped conformal material 15 may also be easily removable following transfer of at least a portion of the dopant 20 to the silicon-containing material 10.

The doped conformal material 15 may be formed at a thickness of from about 17 angstrom (Å) to about 100 Å. The thickness of the doped conformal material 15 may determine an amount (e.g., dose, concentration) of the dopant 20 in the doped conformal material 15, with a thinner doped conformal material 15 containing a higher dopant concentration relative to a thicker doped conformal material 15. However, the dopant concentration may also be tailored independent of the thickness of the doped conformal material 15. The dopant 20 is present in the doped conformal material 15 at a relatively high concentration, such as being substantially saturated with the dopant 20. By way of example only, the doped conformal material 15 may include up to about 35 atomic percent (at. %) of the dopant 20, such as from about 1 at. % to about 35 at. %, from about 5 at. % to about 30 at. %, from about 10 at. % to about 25 at. %, from about 15 at. % to about 30 at. %, from about 15 at. % to about 25 at. %, from about 20 at. % to about 35 at. %, or from about 25 at. % to about 35 at. %. However, lower amounts of the dopant 20 may also be used, such as down to about $1 \times 10^{-17}$ atoms/cm$^3$. In some embodiments, the doped conformal material 15 may include up to about 30 at. % phosphorus in germanium.

The conformal material 25 may function as a medium in which the dopant 20 to be transferred is initially contained. In addition to containing the dopant 20, the conformal material 25 may be easily removable following the transfer of the dopant 20 to the silicon-containing material 10. Since the conformal material 25 is formed as a thin material, the dopant 20 may be dispersed in the conformal material 25, such as being homogeneously dispersed throughout the conformal material 25. The conformal material 25 may be selected such that the dopant 20 exhibits a high degree of diffusivity (e.g., solubility) in the conformal material 25. The conformal material 25 as formed may exhibit a high degree of conformality, such as having a step coverage of greater than or equal to about 90%, such as greater than or equal to about 95%, greater than or equal to about 99%, or about 100%. The conformal material 25 may be formed as a discontinuous material. The conformal material 25 may include, but is not limited to, a germanium material. In some embodiments, the conformal material 25 is germanium. In other embodiments, the conformal material 25 is a germanium material that includes germanium and a small amount of silicon, such as less than about 5 at. % of silicon.

The dopant 20 may be selected to be diffusible in the conformal material 25. By way of example only, the dopant 20 may exhibit a higher diffusion rate in the conformal material 25 than in the silicon-containing material 10. The dopant 20 may be aluminum, antimony, arsenic, boron, gallium, indium, phosphorus, or a combination thereof. In some embodiments, the dopant 20 is phosphorus. The dopant 20 may be present in the conformal material 25 at a high concentration, such as the conformal material 25 being substantially saturated with the dopant 20. The dopant 20 may be present in the conformal material 25 in an amount sufficient to achieve a desired dopant concentration in the silicon-containing material 10 following the dopant 20 transfer.

The doped conformal material 15 may be formed by any deposition technique that provides the high degree of conformality (e.g., step coverage of about 100%), such as by ALD. By way of example only, the doped conformal material 15 may be formed by an in-situ ALD doping process in which the conformal material 25 is formed on the silicon-containing material 10 at substantially the same time as the dopant 20 is incorporated into the conformal material 25. In the in-situ ALD doping process, the conformal material 25 is formed by ALD, coupled with substantially simultaneous introduction of the dopant 20 to produce the doped conformal material 15 having the desired concentration of dopant 20. ALD precursors of the conformal material 25 and of the dopant 20 may be introduced to a chamber of an ALD reactor to form the doped conformal material 15. Suitable ALD precursors are commercially available from numerous sources, such as from MilliporeSigma (St. Louis, Mo.). The conformal material ALD precursor and the dopant ALD precursor may be cyclically and sequentially introduced to the ALD reactor and a desired number of ALD cycles conducted until the desired thickness and desired dopant concentration of the doped conformal material 15 is achieved. The concentration of the dopant 20 in the doped conformal material 15 may be decreased or increased by increasing or decreasing, respectively, the number of conformal material ALD precursor cycles conducted to the number of dopant ALD precursor cycles conducted. In some embodiments, the number of conformal material ALD precursor cycles conducted and the number of dopant ALD precursor cycles conducted are equal. In other embodiments, higher numbers of conformal material ALD precursor cycles are conducted than the number of dopant ALD precursor cycles that are conducted.

The in-situ ALD doping process may be conducted at conventional temperature, pressure, power, and flow rate conditions. By way of example only, the conformal material ALD precursor may be introduced to the ALD reactor with a carrier gas and reacted with a surface of the silicon-containing material 10 to form a monolayer of the conformal material 25 on the silicon-containing material 10. Excess conformal material ALD precursor may be purged from the ALD reactor, followed by introducing the dopant ALD precursor to the ALD reactor with a carrier gas. The dopant ALD precursor may react with sites on the monolayer of the conformal material 25, incorporating the dopant 20 into the conformal material 25. Excess dopant precursor may be removed from the ALD reactor. By alternating and repeating the introduction of the conformal material ALD precursor and the dopant ALD precursor and purging the excess conformal material ALD precursor and dopant ALD precursor, the doped conformal material 15 is formed adjacent to the silicon-containing material 10.

In embodiments where the conformal material 25 includes germanium and the dopant 20 includes phosphorus, a germanium ALD precursor is introduced to the ALD reactor and reacted with sites on the surface of the silicon-containing material 10 to form a monolayer of germanium on exposed horizontal and vertical surfaces of the silicon-containing material 10. The germanium monolayer may be formed as a discontinuous material. After removing the germanium ALD precursor from the ALD reactor, a phosphorus ALD precursor is introduced to the ALD reactor and reacted with sites on the surface of the germanium monolayer to incorporate phosphorus into the germanium monolayer. Phosphorus atoms may replace germanium atoms in the germanium monolayer, forming a discontinuous germanium and phosphorus material on the silicon-containing material 10. In some embodiments, the phosphorus-doped germanium material is formed by an in-situ ALD doping process using a germanium amidinate (GEBAMDN) precursor and a bis-dimethylaminochloro-phosphine (BDMACl-Phos) precursor. However, other germanium precursors or phosphorus precursors may be used. The GEBAMDN precursor may be introduced into the ALD reactor and reacted with ammonia ($NH_3$) as a reducing agent to form the germanium monolayer on the silicon-containing material 10. One cycle of the GEBAMDN precursor may be conducted and followed by one cycle of $NH_3$ to form the germanium monolayer. After purging excess reagents of ALD precursors, the phosphorus may be incorporated into the germanium monolayer by introducing bis-dimethylaminochloro-phosphine (BDMACl-Phos) as the phosphorus precursor into the ALD reactor with ammonia. Then, additional cycles of the GEBAMDN precursor may be conducted, followed by additional cycles of the BDMACl-Phos precursor to incorporate the phosphorus into the germanium and form the phosphorus-doped germanium material at the desired thickness. Alternatively, two cycles of the GEBAMDN precursor may be conducted, followed by one cycle of the BDMACl-Phos precursor. The resulting phosphorus-doped germanium material (e.g., germanium doped with phosphorus) formed on the silicon-containing material 10 may be purely conformal (e.g., having a step coverage of about 100%).

In embodiments where the GEBAMDN precursor and the BDMACl-Phos precursor are used to form a 17 Å phosphorus-doped germanium material, equal numbers of cycles of the GEBAMDN precursor and the BDMACl-Phos precursor are conducted to form the phosphorus-doped germanium material including 30 at. % phosphorus. Conducting additional cycles of the GEBAMDN precursor relative to the BDMACl-Phos precursor increases the thickness of the phosphorus-doped germanium material and decreases the concentration of phosphorus in the phosphorus-doped germanium material.

If the dopant is arsenic, the arsenic ALD precursor may include, but is not limited to, an alkylarsine compound, an alkoxyarsine compound, or an aminoarsine compound, such as arsine, triethylaresenate, trimethylarsine, triethylarsine, triphenylarsine, triphenylarsine oxide, ethylenebis(diphenylarsine), tris(dimethylamino)arsine, or $As(OR)_3$ where R is $—CH_3$ or $—C_2H_5$ or other alkyl groups (including saturated and unsaturated alkyl groups).

If the dopant is antimony, the antimony ALD precursor may include, but is not limited to, triphenylantimony(III), tris-(dimethylamido)antimony(III), tris-(dimethyl-amino) antimony(III), antimony(III) n-butoxide, or antimony(III) n-ethoxide.

If the dopant is boron, the boron ALD precursor may include, but is not limited to, an alkyl borate (e.g., trimethyl borate), trimethylboron, triethylboron, triphenylboron, tri-1-propyl borate, tri-n-amyl borate, B-tribromoborazine, tris (pentafluorophenyl)borane, or a combination thereof.

The doped conformal material 15 may, alternatively, be selectively formed on the silicon-containing material 10. By way of example only, the doped conformal material 15 may be selectively formed on the silicon-containing material 10 depending on surface properties of the silicon-containing material 10. Alternatively the surface of the silicon-containing material 10 may be modified to include various functional groups that prevent or enhance the formation of the doped conformal material 15 on certain locations of the silicon-containing material 10.

A cap material 30 may be formed over the doped conformal material 15. While FIG. 2 illustrates the cap material 30, the cap material 30 is optional. The cap material 30, when present, may reduce or prevent transfer (e.g., diffusion) of the dopant 20 in an undesirable direction, such as into an environment surrounding the doped conformal material 15. The cap material 30 may be a dielectric material or a metal material and may function as a barrier material. By way of example only, the cap material 30 may be a silicon nitride material or a silicon oxide material. The cap material 30 may be conformally formed over the doped conformal material 15, such as by an ALD process. The cap material 30 may be conformally formed at a thickness of from about 1 Å to about 10 Å.

Figure 3:
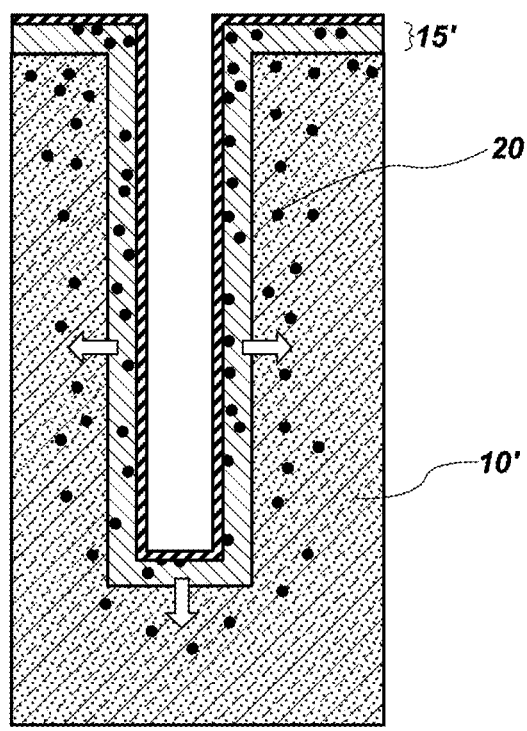

An annealing act may be conducted to transfer (e.g., diffuse) at least a portion of the dopant 20 into the silicon-containing material 10 and form the doped silicon-containing material 10', as shown in FIG. 3. The direction of the dopant 20 diffusion is indicated in FIG. 3 by arrows. With the optional cap material 30 on a surface of the doped conformal material 15 distal to the silicon-containing material 10, the dopant 20 diffuses into the silicon-containing material 10 and forms the doped silicon-containing material 10'. The silicon-containing material 10 and the doped conformal material 15 may be exposed to annealing conditions to diffuse the at least a portion of the dopant 20 into the silicon-containing material 10. Depending on the anneal conditions (temperature, anneal pressure, anneal time, etc.) used, substantially all of the dopant 20 may diffuse into the silicon-containing material 10 or only a portion of the dopant 20 may diffuse into the silicon-containing material 10. The silicon-containing material 10 becomes enriched in the dopant 20, forming the doped silicon-containing material 10', and the doped conformal material 15 becomes depleted in the dopant 20, forming a depleted doped conformal material 15'. The depleted doped conformal material 15' may include some dopant 20, such as a small amount of the dopant 20, or may be substantially free of the dopant 20 depending on the degree of transfer of the dopant 20.

The annealing act includes heating the silicon-containing material 10 and the doped conformal material 15 in a non-oxidizing environment. The silicon-containing material 10 and doped conformal material 15 may be heated to a temperature of from about 500° C. to about 920° C., such as from about 500° C. to about 900° C., such as from about 500° C. to about 850° C., from about 500° C. to about 800° C., from about 500° C. to about 750° C., from about 500° C. to about 700° C., from about 500° C. to about 650° C., from about 500° C. to about 600° C., from about 500° C. to about 550° C., from about 550° C. to about 900° C., from about 600° C. to about 900° C., from about 650° C. to about 900° C., from about 700° C. to about 900° C., from about 750° C. to about 900° C., from about 800° C. to about 900° C., or from about 850° C. to about 900° C. The annealing act may be conducted in a non-oxidizing environment, such as in the presence of a noble gas (e.g., argon, helium) or other inert gas (e.g., nitrogen). The silicon-containing material 10 and the doped conformal material 15 may be heated for an amount of time sufficient for the desired amount of the dopant 20 to diffuse. The diffusion time may range from about 1 minute to about 60 minutes, such as from about 2 minutes to about 30 minutes, from about 5 minutes to about 30 minutes, from about 10 minutes to about 30 minutes, from about 15 minutes to about 30 minutes, from about 20 minutes to about 30 minutes, or from about 25 minutes to about 30 minutes. The silicon-containing material 10 and the doped conformal material 15 may also be subjected to a higher temperature for a shorter amount of time, such as to a so-called "flash anneal" at the higher temperature for an amount of time ranging from milliseconds to less than or equal to about 30 seconds. By way of example only, the silicon-containing material 10 and the doped conformal material 15 may be subjected to a temperature of about 1050° C. for less than or equal to about 30 seconds. The annealing act may also include activation by microwave or laser energy.

The amount of dopant 20 that diffuses into the silicon-containing material 10 may be tailored by adjusting the anneal conditions, such as the anneal temperature, anneal pressure, and anneal time. Heating the silicon-containing material 10 for a longer amount of time and at a higher temperature and pressure increases the amount of dopant 20 in the doped silicon-containing material 10' and a depth to which the dopant 20 diffuses. Shorter anneal times result in transfer of less of the dopant 20 and a shallower depth to which the dopant 20 is incorporated in the doped silicon-containing material 10'. While FIG. 3 shows the diffusion of a portion of the dopant 20, substantially all of the dopant 20 may diffuse from the conformal material 25 and be incorporated into the silicon-containing material 10 depending on the anneal conditions used. The doped silicon-containing material 10' may include a high concentration of the dopant 20 along the sidewalls and horizontal surfaces of the doped silicon-containing material 10'. Depending on the thickness of the silicon-containing material 10, the doped silicon-containing material 10' may include a gradient of the dopant 20 or the sidewalls and horizontal surfaces of the doped silicon-containing material 10' may include substantially uniform amounts of the dopant 20 distributed along an interface between the silicon-containing material 10 and the conformal material 25. Since the doped conformal material 15 is conformally formed on the silicon-containing material 10, the dopant 20 may be substantially uniformly distributed in the doped silicon-containing material 10'.

If, for example, the doped conformal material 15 includes germanium and phosphorus at up to about 30 at. % of phosphorus, the doped silicon-containing material 10' may include up to about 30 at. % of phosphorus following the annealing act. In embodiments where equal numbers of cycles of the GEBAMDN precursor and the BDMACl-Phos precursor are conducted and form the 17 Å phosphorus-doped germanium material including about 30 at. % phosphorus, substantially all of the phosphorus is transferred to the silicon-containing material 10 such that the resulting doped silicon-containing material 10' contains about 30 at. % phosphorus.

Figure 4:
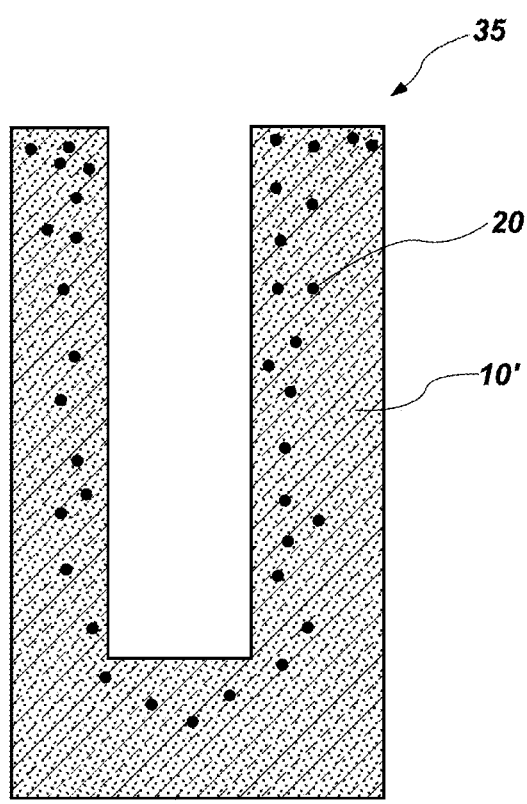

After the diffusion of the dopant 20 is substantially complete, the cap material 30, if present, and the depleted doped conformal material 15' may be removed without damaging the doped silicon-containing material 10', as shown in FIG. 4. The cap material 30 and the depleted doped conformal material 15' may be subjected to one or more removal acts (e.g., etch acts) by exposing the cap material 30 and the depleted doped conformal material 15' to one or more etch chemistries. The cap material 30 and the depleted doped conformal material 15' may be removed using a single etch chemistry or using multiple etch chemistries. The cap material 30 may be removed by conventional techniques. Since the doped conformal material 15 was conformally formed, the depleted doped conformal material 15' may be easily removed without overetching or underetching adjacent materials.

By way of example only, if germanium is used as the conformal material 25 and the dopant 20 is phosphorus, the depleted phosphorus-doped germanium material may be easily removed after the annealing act by exposing the depleted phosphorus-doped germanium material to a solution, such as water or an aqueous solution. The aqueous solution may include, but is not limited to, an aqueous solution containing ammonium hydroxide and hydrogen peroxide (4:1:1 water/hydrogen peroxide/ammonium hydroxide). Following the annealing act, at least a portion of the germanium may be converted to germanium oxide, which is also soluble in water. Therefore, the depleted phosphorus-doped germanium material is easily removed without damaging the phosphorus-doped silicon-containing material 10'.

Accordingly, a method of doping a silicon-containing material is disclosed. The method comprises forming at least one opening in a silicon-containing material and conformally forming a doped germanium material in the at least one opening and adjacent to the silicon-containing material. A dopant of the doped germanium material is transferred into the silicon-containing material.

Accordingly, a method of forming a semiconductor device is disclosed. The method comprises forming a silicon-containing material comprising at least one opening therein. The at least one opening comprises an aspect ratio of greater than or equal to about 30:1. A germanium material is formed adjacent to the silicon-containing material and at least one dopant is simultaneously incorporated into the germanium material. The at least one dopant is diffused into the silicon-containing material to form a doped silicon-containing material. The germanium material is removed.

The doped silicon-containing material 10' formed by embodiments of the disclosure may define HAR features 35 including, but not limited to, source/drain regions, shallow junction regions, contacts (e.g., HAR contacts), wordlines, or other HAR features 35 including a uniform dopant profile on its sidewalls. Since a thin amount of the doped conformal material 15 is conformally formed and exhibits a step coverage of about 100%, the amount of dopant 20 in the doped silicon-containing material 10' (e.g., the HAR features 35) is controlled at an atomic level. The HAR feature 35 includes the dopant 20 uniformly distributed in the sidewalls and the horizontal surfaces of the silicon-containing material 10 following the annealing act. Therefore, the HAR features 35 formed by embodiments of the disclosure may exhibit a high concentration of the dopant 20 that is uniformly dispersed relative to conventional processes of doping HAR features.

Figure 5:
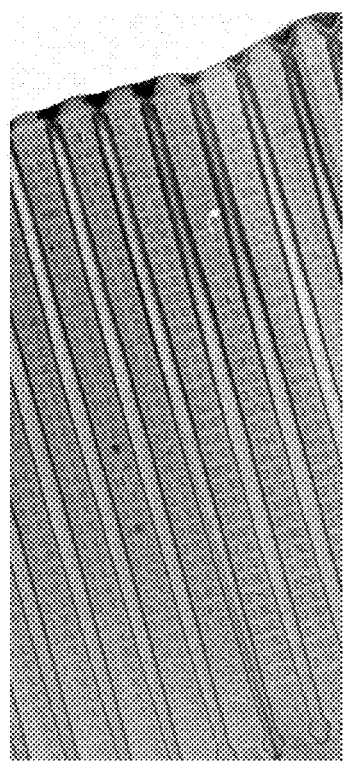
FIGS. 5 and 6 are scanning electron microscope (SEM) images showing phosphorus doping of a germanium material in accordance with embodiments of the disclosure.
Figure 6:
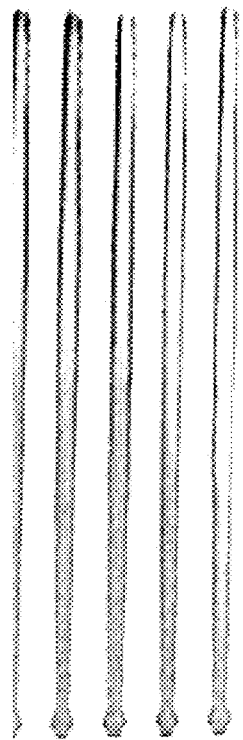
Figure 7:
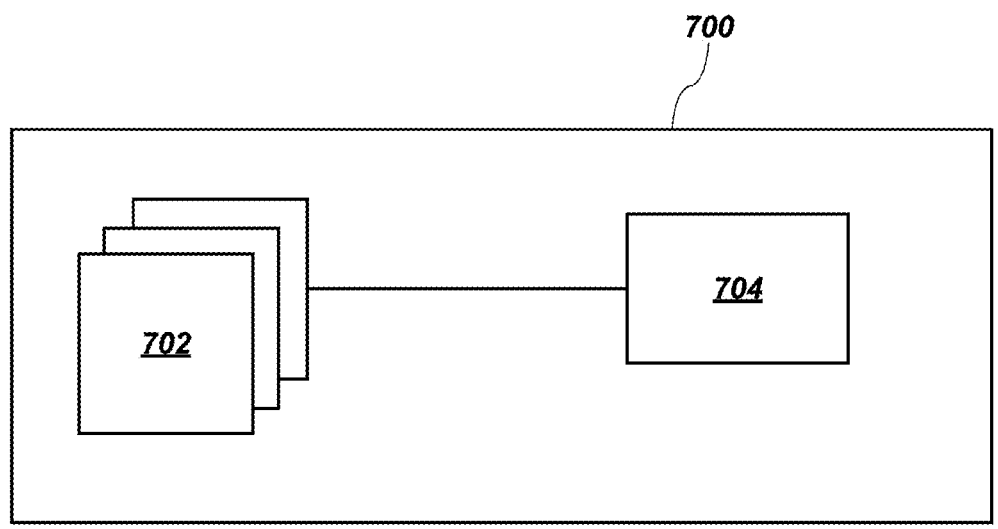
FIG. 7 is a schematic block diagram illustrating a semiconductor device including a doped silicon-containing material formed in accordance with embodiments of the disclosure.

The doped silicon-containing material 10' (the HAR features 35) may be present in an apparatus (e.g., a semiconductor device 700) that includes, but is not limited to, a DRAM device, a NAND device, a FinFET device, a crosspoint device, or other memory device. As shown in FIGS. 5 and 6, where the conformal material 25 includes germanium and the dopant 20 includes phosphorus, the phosphorus-doped germanium material (FIG. 6) is conformally formed at a uniform thickness over HAR features 35 of a 3D NAND device (FIG. 5). The phosphorus-doped germanium is formed at a thickness of about 17 Å over the HAR features 35 of the 3D NAND device. The semiconductor device 700 including the HAR features 35 may be formed by conducting additional process acts depending on the semiconductor device 700 to be formed. The subsequent process acts are also conducted to connect the HAR features 35 to other components of the semiconductor device 700. The subsequent process acts are conducted by conventional techniques, which are not described in detail herein. By way of example only, the semiconductor device 700 may be a memory device that includes the HAR features 35 in a memory array of memory cells. The semiconductor device 700, such as a memory device, is also disclosed, as shown schematically in FIG. 7. The semiconductor device 700 includes a memory array 702 of memory cells including the HAR features 35 and a control logic component 704. The control logic component 704 may be configured to operatively interact with the memory array 702 so as to read, write, or re-fresh any or all memory cells within the memory array 702.

Figure 8:
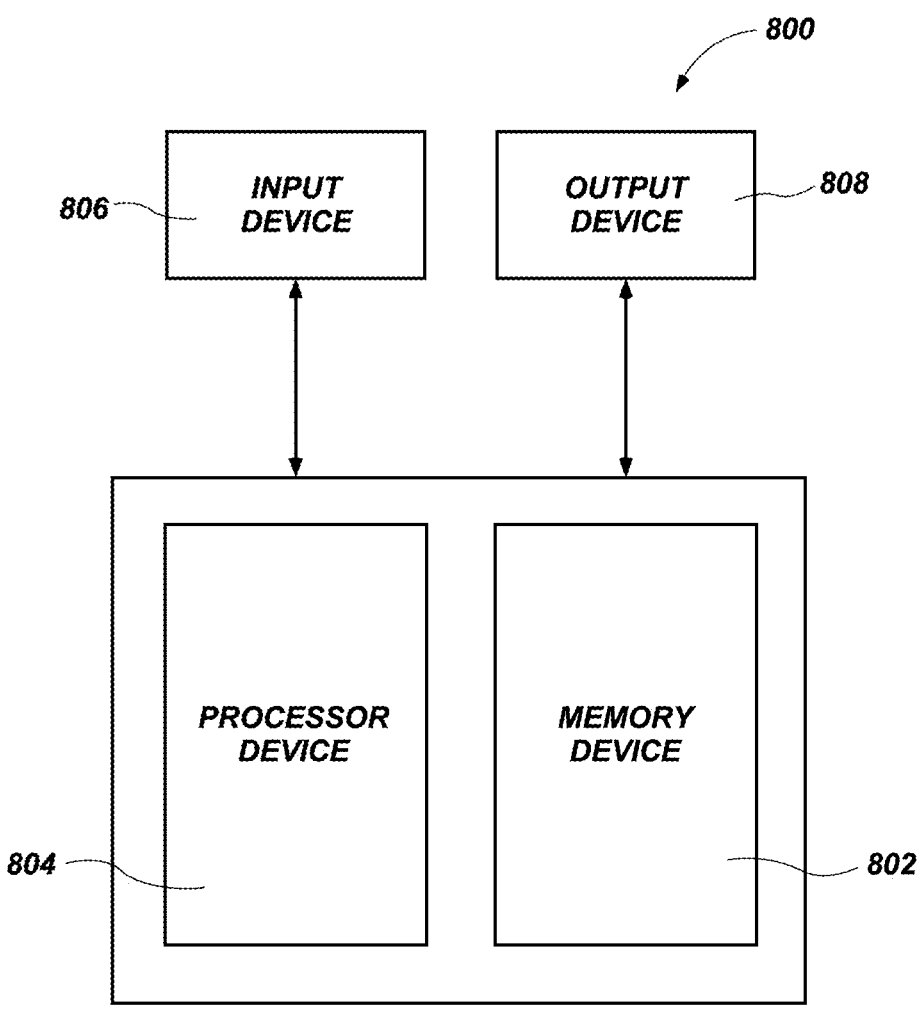
FIG. 8 is a schematic block diagram illustrating a system including the doped silicon-containing material formed in accordance with embodiments of the disclosure.

A system 800 is also disclosed, as shown in FIG. 8, and includes the HAR features 35. FIG. 8 is a simplified block diagram of the system 800 implemented according to one or more embodiments described herein. The system 800 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The system 800 includes at least one memory device 802, which includes memory cells including the HAR features 35 as previously described. The system 800 may further include at least one processor device 804 (often referred to as a "processor"). The processor device 804 may, optionally, include the HAR features 35 as previously described. The system 800 may further include one or more input devices 806 for inputting information into the system 800 by a user, such as, for example, a mouse or other pointing device, a keyboard, a touchpad, a button, or a control panel. The system 800 may further include one or more output devices 808 for outputting information (e.g., visual or audio output) to a user such as, for example, a monitor, a display, a printer, an audio output jack, a speaker, etc. In some embodiments, the input device 806 and the output device 808 may comprise a single touchscreen device that can be used both to input information to the system 800 and to output visual information to a user. The one or more input devices 806 and output devices 808 may communicate electrically with at least one of the memory device 804 and the processor device 804.

Accordingly, a semiconductor device is disclosed. The semiconductor devices comprises at least one feature comprising a doped silicon-containing material and an aspect ratio of from about 30:1 to about 100:1. The doped silicon-containing material comprises at least one dopant uniformly dispersed therein.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of doping a silicon-containing material, comprising:
    forming at least one opening in a silicon-containing material;
    conformally forming a doped germanium material in the at least one opening and adjacent to the silicon-containing material; and
    transferring a dopant of the doped germanium material into the silicon-containing material.

2. The method of claim 1, wherein forming at least one opening in a silicon-containing material comprises forming the at least one opening comprising an aspect ratio of from about 30:1 to about 200:1.

3. The method of claim 1, wherein forming at least one opening in a silicon-containing material comprises forming the at least one opening comprising an aspect ratio of from about 50:1 to about 100:1.

4. The method of claim 1, wherein conformally forming a doped germanium material in the at least one opening and adjacent to the silicon-containing material comprises conformally forming the doped germanium material by an in-situ atomic layer doping process.

5. The method of claim 1, wherein conformally forming a doped germanium material in the at least one opening and adjacent to the silicon-containing material comprises conformally forming a germanium material comprising at least one of aluminum, antimony, arsenic, boron, gallium, indium, or phosphorus.

6. The method of claim 1, wherein conformally forming a doped germanium material in the at least one opening and adjacent to the silicon-containing material comprises conformally forming the doped germanium material at a thickness of from about 17 angstrom (Å) to about 100 Å.

7. The method of claim 1, wherein transferring a dopant of the doped germanium material into the silicon-containing material comprises subjecting the doped germanium material to an annealing act.

8. The method of claim 1, further comprising forming a barrier material over the doped germanium material.

9. The method of claim 1, further comprising removing the doped germanium material.

10. A method of forming a semiconductor device, comprising:
- forming a silicon-containing material comprising at least one opening therein, the at least one opening comprising an aspect ratio of greater than or equal to about 30:1;
- simultaneously forming a germanium material adjacent to the silicon-containing material and incorporating at least one dopant into the germanium material;
- diffusing the at least one dopant into the silicon-containing material to form a doped silicon-containing material; and
- removing the germanium material.

11. The method of claim 10, wherein simultaneously forming a germanium material adjacent to the silicon-containing material and incorporating at least one dopant into the germanium material comprises forming the germanium material exhibiting a step coverage of greater than or equal to about 95%.

12. The method of claim 10, wherein simultaneously forming a germanium material adjacent to the silicon-containing material and incorporating at least one dopant into the germanium material comprises homogeneously dispersing the at least one dopant in the germanium material.

13. The method of claim 10, wherein simultaneously forming a germanium material adjacent to the silicon-containing material and incorporating at least one dopant into the germanium material comprises dispersing up to about 30 atomic percent of phosphorus in the germanium material.

14. The method of claim 10, wherein simultaneously forming a germanium material adjacent to the silicon-containing material and incorporating at least one dopant into the germanium material comprises exposing the silicon-containing material to a germanium amidinate precursor to form a germanium monolayer thereon and exposing the germanium monolayer to a bis-dimethylaminochloro-phosphine precursor.

15. The method of claim 10, wherein diffusing the at least one dopant into the silicon-containing material comprises annealing the germanium material.

16. The method of claim 10, wherein diffusing the at least one dopant into the silicon-containing material comprises exposing the germanium material to a temperature of from about 500° C. to about 920° C.

17. The method of claim 10, wherein removing the germanium material comprises exposing the germanium material to an aqueous solution.

18. The method of claim 10, further comprising forming at least one semiconductor component adjacent to the doped silicon-containing material.

19. The method of claim 1, wherein transferring a dopant of the doped germanium material into the silicon-containing material comprises forming a doped silicon-containing material comprising at least one dopant uniformly dispersed therein.

20. The method of claim 19, wherein forming a doped silicon-containing material comprising at least one dopant uniformly dispersed therein comprises forming the doped silicon-containing material comprising silicon, polysilicon, a silicon oxide, or a combination thereof.

21. The method of claim 19, wherein forming a doped silicon-containing material comprising at least one dopant uniformly dispersed therein comprises forming the doped silicon-containing material comprising at least one of aluminum, antimony, arsenic, boron, gallium, indium, or phosphorus.

22. The semiconductor device method of claim 19, wherein forming a doped silicon-containing material comprising at least one dopant uniformly dispersed therein comprises uniformly dispersing the at least one dopant in sidewalls and horizontal surfaces of the silicon-containing material.

23. The method of claim 19, wherein forming a doped silicon-containing material comprising at least one dopant uniformly dispersed therein comprises forming the doped silicon-containing material configured as a source/drain region, shallow junction region, high aspect ratio contact, or wordline.

24. The method of claim 10, wherein forming a silicon-containing material comprising at least one opening therein comprises forming the silicon-containing material exhibiting an aspect ratio of from about 60:1 to about 200:1.

* * * * *

UNITED STATES PATENT AND TRADEMARK OFFICE
CERTIFICATE OF CORRECTION

PATENT NO. : 10,937,654 B2
APPLICATION NO. : 16/256918
DATED : March 2, 2021
INVENTOR(S) : Francois H. Fabreguette, John A. Smythe and Witold Kula Page 1 of 1

It is certified that error appears in the above-identified patent and that said Letters Patent is hereby corrected as shown below:

In the Specification
Column 4, Line 39, change "("SOP")" to --("SOI")--
Column 5, Line 41, change "angstrom (|)" to --angstrom (Å)--

Signed and Sealed this
Twenty-seventh Day of April, 2021

Drew Hirshfeld
*Performing the Functions and Duties of the*
*Under Secretary of Commerce for Intellectual Property and*
*Director of the United States Patent and Trademark Office*